United States Patent
Kawabata et al.

(10) Patent No.: US 12,055,570 B2
(45) Date of Patent: Aug. 6, 2024

(54) MEASUREMENT APPARATUS, MEASUREMENT METHOD AND COMPUTER READABLE MEDIUM

(71) Applicant: ADVANTEST CORPORATION, Tokyo (JP)

(72) Inventors: Masayuki Kawabata, Saitama (JP); Mitsuo Matsumoto, Tokyo (JP); Shinya Sato, Saitama (JP); Masakatsu Suda, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 5 days.

(21) Appl. No.: 17/752,816

(22) Filed: May 24, 2022

(65) Prior Publication Data

US 2023/0052937 A1 Feb. 16, 2023

(30) Foreign Application Priority Data

Aug. 10, 2021 (JP) .................... 2021-130511

(51) Int. Cl.
*G01R 23/02* (2006.01)
*G01R 31/28* (2006.01)

(52) U.S. Cl.
CPC ......... *G01R 23/02* (2013.01); *G01R 31/2851* (2013.01)

(58) Field of Classification Search
CPC ........ G01R 23/00; G01R 23/02; G01R 23/07; G01R 23/16; G01R 23/165; G01R 31/2851; G01R 31/2853; G01R 31/2884; G01R 31/2896; G01R 31/316; G01R 31/3167; G01R 31/317; G01R 31/2836;
(Continued)

(56) References Cited

U.S. PATENT DOCUMENTS 4,093,988 A * 6/1978 Scott ................ H04B 3/46
702/77
6,236,371 B1 * 5/2001 Beck .................. H04B 17/20
455/67.14
(Continued)

FOREIGN PATENT DOCUMENTS

JP H1014898 A 1/1998

OTHER PUBLICATIONS

Libor Rufer et al., "On-Chip testing of MEMS using pseudo-random test sequences", [online], ReserchGate, [searched on Jul. 23, 2021], the Internet (URL: https://www.researchgate.net/publication/4068737_On-chip_testing_of_MEMS_using_pseudo-random_test_sequences).
(Continued)

*Primary Examiner* — Son T Le
*Assistant Examiner* — Matthew W. Baca

(57) ABSTRACT

Provided is a measurement apparatus including a signal source configured to output a binary digital signal configuring a multi-tone waveform, a waveform acquisition unit configured to acquire an analog signal waveform generated in response to application of the digital signal to a device under test, and a computation unit configured to calculate a frequency characteristic of the device under test from the waveform acquired by the waveform acquisition unit, in which the signal source is configured to repeatedly output a signal upconverted by multiplying a pseudo-random binary sequence (PRBS) signal by a repeating rectangular wave with a reference frequency and a reference duty ratio.

15 Claims, 10 Drawing Sheets

(58) Field of Classification Search
CPC .... G01R 31/2837; G01R 27/00; G01R 27/02; G01R 27/26; G01R 27/30; G01R 23/18; G01R 23/08; G01R 27/06; G01R 27/28; G01R 27/2623; G01R 27/2688; G01R 31/28; G01R 31/2832; G01R 31/2812; G01R 31/26; G01R 31/27; G01R 31/2601; G01R 31/2607; G01R 31/2612; G01R 31/2806

See application file for complete search history.

(56) References Cited

U.S. PATENT DOCUMENTS

| | | | |
|---|---|---|---|
| 2010/0158076 A1* | 6/2010 | Snlyely | H04B 1/7075 375/130 |
| 2011/0119010 A1* | 5/2011 | Yuki | G01R 31/31711 702/82 |
| 2016/0305996 A1* | 10/2016 | Märtens | G01R 27/02 |
| 2020/0292615 A1* | 9/2020 | Wu | G01R 31/2891 |

OTHER PUBLICATIONS

Vytautas Dumbrava et al., "Uncertainty analysis of I-V impedance measurement technique", ReserchGate, [searched on Jul. 23, 2021], the Internet (URL: https://www.researchgate.net/publication/256232481_Uncertainty_analysis_of_I-V_impedance_measurement_technique).

* cited by examiner

MEASUREMENT APPARATUS, MEASUREMENT METHOD AND COMPUTER READABLE MEDIUM

The contents of the following Japanese patent application are incorporated herein by reference:
2021-130511 filed in JP on Aug. 10, 2021

BACKGROUND

1. Technical Field

The present invention relates to a measurement apparatus, a measurement method, and a computer readable medium.

2. Related Art

Non-Patent Documents 1 and 2 and Patent document 1 describe that: "The first m components of the impulse response (h(k), k=0 to m−1) can be obtained by following the scheme shown in FIG. 8. Each of these m components correspond to the output of a simplified correlation cell (SCC) shown in FIG. 7. The input signal of the SCCs is the response to the MLS of the device under test (after an Analogue to Digital conversion)." (Chapter 5 in Non-Patent Document 1) and the like".

LIST OF CITED REFERENCES

Patent Documents

Non-Patent Document 1: L. Rufer, and three others, "On-Chip testing of MEMS using pseudo-random test sequences", [online], ReserchGate, [searched on Jul. 23, 2021], the Internet <URL: https://www.researchgate.net/publication/4068737_On-chip_testing_of_MEMS_using_pseudo-random_test_sequences>

Non-Patent Document 2: Vytautas Dumbrava, and one other, "Uncertainty analysis of I-V impedance measurement technique", ReserchGate, [searched on Jul. 23, 2021], the Internet <URL: https://www.researchgate.net/publication/256232481_Uncertainty_analysis_of_I-V_impedance_measurement_technique>

Patent Document 1: Japanese Patent Application Publication No. Hei. 10-14898

DESCRIPTION OF EXEMPLARY EMBODIMENTS

Hereinafter, the present invention will be described through embodiments of the invention, but the following embodiments do not limit the invention according to the claims. In addition, not all combinations of the features described in the embodiments necessarily have to be essential to solving means of the invention.

1. Test System 1

Figure 1:
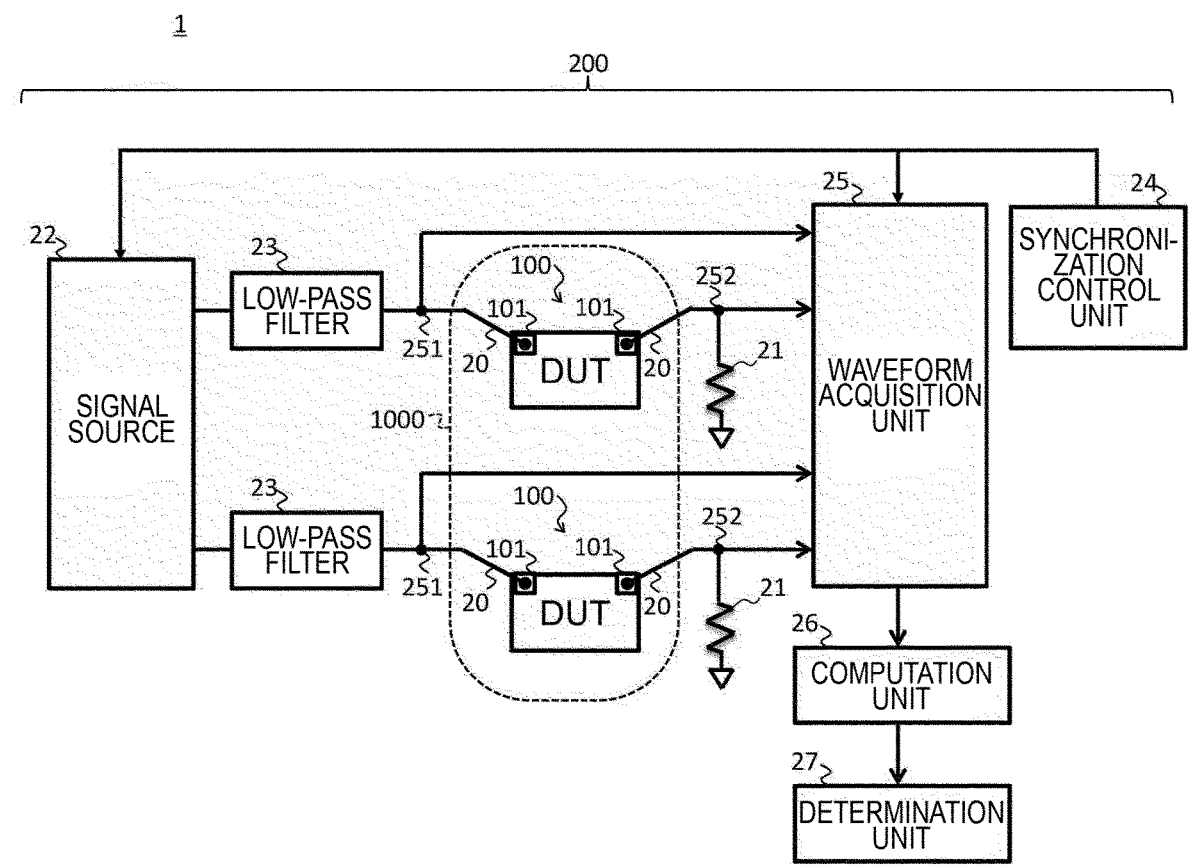
FIG. 1 illustrates a test system 1 according to an embodiment.

FIG. 1 illustrates a test system 1 according to an embodiment. The test system 1 includes a device under test (DUT) 100 and a measurement apparatus 200.

1-1. Device Under Test 100

The device under test 100 has at least one terminal 101 (according to the present embodiment, two terminals as an example), and is tested by measuring a frequency characteristic by the measurement apparatus 200. The device under test 100 may be a MEMS device such as a piezoelectric element, and a plurality of the devices under test 100 may be arranged on a wafer 1000.

1-2. Measurement Apparatus 200

The measurement apparatus 200 is configured to measure a frequency characteristic of the device under test 100. According to the present embodiment, as an example, the measurement apparatus 200 may measure an impedance of the device under test 100 by a transfer impedance conversion method. In addition, the measurement apparatus 200 may test the device under test 100 based on a measurement result.

The measurement apparatus 200 has a plurality of probes 20, a plurality of reference resistors 21, a signal source 22, a plurality of low-pass filters 23, a synchronization control unit 24, a waveform acquisition unit 25, a computation unit 26, and a determination unit 27.

1-2-1. Probe 20

The plurality of probes 20 are respectively electrically connected to the plurality of devices under test 100. According to the present embodiment, as an example, the plurality of probes 20 may be respectively electrically connected to the two terminals 101 in the device under test 100. Each of the probes 20 may be arranged on a bottom surface of a liftable substrate (not illustrated), facing a front surface of the wafer 1000.

1-2-2. Reference Resistor 21

Each of the reference resistors 21 is connected in series to the device under test 100. One end of a series circuit of the reference resistor 21 and the device under test 100 may be connected to a ground potential (as an example, an earth potential). According to the present embodiment, as an example, an end portion on a reference resistor 21 side in each series circuit of the reference resistor 21 and the device under test 100 may be connected to the ground potential. Each of the reference resistors 21 may be arranged on a same substrate as the probe 20.

Each of the reference resistors 21 may have a given resistance value. From a viewpoint of increase in measurement accuracy of the frequency characteristic of the device under test 100, a resistance value of each of the reference resistors 21 is preferably a value close to an estimated value of the impedance of the device under test 100 connected in series to the reference resistor 21.

1-2-3. Signal Source 22

The signal source 22 is configured to output a binary digital signal configuring a multi-tone waveform. The multi-tone waveform may be a waveform having a plurality of frequency components. The signal source 22 may repeatedly output a signal of a reference pattern. The signal source 22 may supply the digital signal to at least one of the device under test 100 or the waveform acquisition unit 25.

1-2-4. Low-Pass Filter 23

The low-pass filter 23 is arranged between the signal source 22 and the device under test 100. The low-pass filter 23 may be provided for each of the devices under test 100. The low-pass filter 23 may be arranged on the same substrate as the probe 20.

The low-pass filter 23 may remove a high frequency component of the digital signal output from the signal source 22. In other words, the low-pass filter 23 may round a waveform of the digital signal. In addition, the low-pass filter 23 may prevent multiple reflection of the digital signal, and may realize impedance matching with a transmission path of the digital signal in a band of a cutoff frequency. For example, the low-pass filter 23 may be an RC low-pass filter having a resistor and a capacitor which are serially connected, and when an impedance of the transmission path of the digital signal is 50Ω, a resistance value of the low-pass filter 23 may be 50Ω, an electrostatic capacitance may be 0.01 μF, and the cutoff frequency may be 160 kHz.

1-2-5. Waveform Acquisition Unit 25

The waveform acquisition unit 25 is configured to acquire an analog signal waveform generated in response to application of a digital signal to the device under test 100. The waveform acquisition unit 25 may acquire a response waveform indicating a response of the device under test 100 to the digital signal. The waveform acquisition unit 25 may acquire an analog signal waveform of each of the plurality of devices under test 100. The waveform acquisition unit 25 may be a digitizer, and may acquire an analog signal waveform indicated by a digital value by sequentially acquiring an analog signal value as a digital signal value.

The waveform acquisition unit 25 may acquire the analog signal waveform at each of a first measurement point 251 on a side of the signal source 22 relative to the device under test 100 and the reference resistor 21, and a second measurement point 252 between the device under test 100 and the reference resistor 21. The first measurement point 251 may be on a side of the signal source 22 relative to the series circuit of the device under test 100 and the reference resistor 21, and may be between the series circuit and the low-pass filter 23. The waveform acquisition unit 25 may cause a storage unit which is not illustrated in the drawing to store the acquired analog signal waveform, and also may supply the analog signal waveform to the computation unit 26.

1-2-6. Synchronization Control Unit 24

The synchronization control unit 24 is configured to cause the waveform acquisition unit 25 to be synchronous with the signal source 22. With this configuration, the waveform acquisition unit 25 is configured to acquire an analog signal waveform in synchronism with the signal source 22. The synchronization control unit 24 may cause output timing of the signal by the signal source 22 to be synchronous with timing at which the waveform is acquired by the waveform acquisition unit 25 by supplying a synchronization signal to each of the signal source 22 and the waveform acquisition unit 25. Note that the synchronization control unit 24 may control not only the synchronization of the waveform acquisition unit 25 and the signal source 22 but also an operation of each unit of the measurement apparatus 200.

1-2-7. Computation Unit 26

The computation unit 26 is configured to calculate a frequency characteristic of the device under test 100 from the waveform acquired by the waveform acquisition unit 25. The computation unit 26 may calculate the frequency characteristic of the device under test 100 from a waveform acquired at the first measurement point 251, that is, a waveform of a voltage signal applied to the device under test 100, and a waveform acquired at the second measurement point 252, that is, a waveform of a voltage signal (according to the present embodiment, as an example, the output signal from the device under test 100) which is obtained by dividing the voltage signal applied to the device under test 100 by the reference resistor 21 and the device under test 100. The computation unit 26 may calculate the frequency characteristic of each of the plurality of devices under test 100. The calculated frequency characteristic may be varied due to adhesion of a foreign substance such as dust to the device under test 100. The computation unit 26 may supply a calculation result to the determination unit 27.

1-2-8. Determination Unit 27

The determination unit 27 is configured to determine a quality of the device under test 100 based on the calculated frequency characteristic. For example, the determination unit 27 may determine the device under test 100 as faulty according to the calculated frequency characteristic being out of a reference range. The determination unit 27 may determine the quality of each of the plurality of devices under test 100. The determination unit 27 may output a determination result to a display unit or the like which is not illustrated in the drawing.

In accordance with the measurement apparatus 200 described above, since the frequency characteristic is measured using the signal source 22 configured to output the binary digital signal, cost reduction of the measurement apparatus 200 can be achieved as compared with a case where the frequency characteristic is measured using the signal source 22 configured to output an analog signal of any waveform. In addition, since the digital signal of the multi-tone waveform is used, a measurement time period can be shortened as compared with a case where a single-tone sine-wave signal is used while sweeping a frequency.

In addition, since the high frequency component is removed from the digital signal applied to the device under test 100 by the low-pass filter 23, the application of the high frequency component to the device under test 100, which is not necessary for the measurement of the frequency characteristic of the device under test 100, can be prevented, and furthermore, a frequency component including aliasing noise or the like at the time of waveform observation can be removed, so that calculation accuracy of the frequency characteristic can be improved. In addition, multiple reflection of the digital signal in the transmission path can be prevented.

In addition, since the analog signal waveform is acquired at each of the first measurement point 251 on the side of the signal source 22 relative to the device under test 100 and the reference resistor 21 and the second measurement point 252 between the device under test 100 and the reference resistor 21, the frequency characteristic of the device under test 100 can be calculated by the transfer impedance method.

In addition, since the waveform acquisition unit 25 acquires the analog signal waveform in synchronism with the signal source 22, the frequency characteristic can be stably measured with high repetition reproducibility.

In addition, since the plurality of probes 20 are provided to be respectively electrically connected to the plurality of devices under test 100, the frequency characteristics of the plurality of the devices under test 100 can be collectively measured.

In addition, since the reference resistor 21 and the low-pass filter 23 are arranged on the same substrate as the probe 20, as compared with a case where the reference resistor 21 and the low-pass filter 23 are arranged on separate substrates, miniaturization of the measurement apparatus 200 can be achieved, and also the transmission path for the signal can be shortened.

2. Operation Waveform

2-1. Digital Signal

Figure 2:
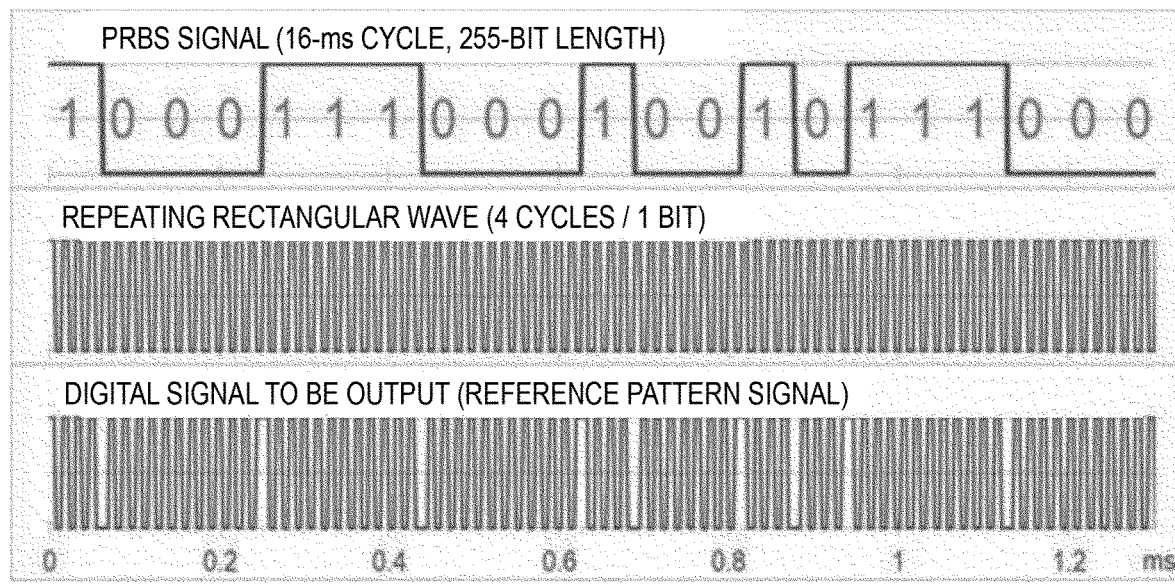
FIG. 2 illustrates a part of a digital signal output from a signal source 22.

FIG. 2 illustrates a part of a digital signal output from the signal source 22.

The signal source 22 may repeatedly output a signal (also referred to as a reference pattern signal) which is upconverted (also referred to as resolution enhancement) by multiplying a pseudo-random binary sequence (PRBS) signal by a repeating rectangular wave with a reference frequency and a reference duty ratio.

The PRBS signal may be generated by a conventionally known technique. According to the present embodiment, as an example, a cycle of the PRBS signal may be set according to a reciprocal of a frequency resolution in an analysis of the frequency characteristic of the device under test 100. As an example, when the frequency resolution is set at 62.5 Hz, the cycle of the PRBS signal may be set at 16 ms (=1000/62.5 Hz). The PRBS signal may be a 255-bit length signal.

The repeating rectangular wave may be a signal with a multiple of a bit rate of the PRBS signal, and each bit signal of the PRBS may be upconverted into multiple bit signals by being multiplied by the PRBS signal. Herein, a frequency component with high signal power among frequency components of the analog signal waveform acquired by the waveform acquisition unit 25 is varied according to a bit rate of the repeating rectangular wave. Therefore, the bit rate of the repeating rectangular wave is preferably set such that the frequency component with the high signal power is to be close to a resonance frequency of the device under test 100. According to the present embodiment, as an example, the resonance frequency of the device under test 100 is 60 kHz, and the bit rate of the repeating rectangular wave may be set to be 8 times as high as that of the PRBS signal.

A reference pattern signal upconverted and generated may be a signal with a cycle of 16 ms similarly as in the PRBS signal. With this configuration, since the digital signal in which the reference pattern signal is repeated includes the frequency components of at least 62.5 Hz (=1000/16 ms), the frequency resolution in the analysis of the frequency characteristic of the device under test 100 is set at 62.5 Hz. Note that the frequency resolution is in proportion to a bit rate (that is, a frequency), and is in inverse proportion to a length of a reference pattern (that is, a bit count). Therefore, the frequency resolution is decreased as the reference pattern is lengthened, and the frequency resolution is increased as the bit rate is increased.

In accordance with the signal source 22 described above, since the frequency component in which the signal power is increased among the frequency components included in the acquired analog signal waveform can be adjusted by the reference frequency of the repeating rectangular wave, a peak of the signal power can be positioned at a desired frequency such as the resonance frequency of the device under test 100. Therefore, while decrease in the signal power due to dispersion is prevented, the frequency resolution can be decreased by increasing the bit count included in a signal pattern. Thus, while the decrease in the signal power is prevented, the frequency resolution can be improved.

Note that the signal source 22 may sequentially generate the reference pattern signal to be output by multiplication of the PRBS signal by the repeating rectangular wave, or may store the reference pattern signal to be output in advance.

2-2. Analog Signal

Figure 3:
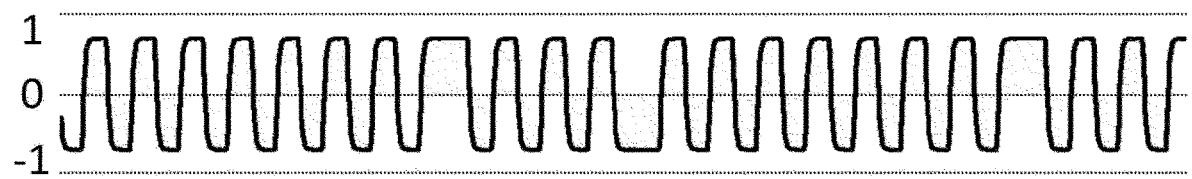
FIG. 3 illustrates an analog signal waveform acquired by a waveform acquisition unit 25 upon application of the digital signal of FIG. 2.
Figure 4:
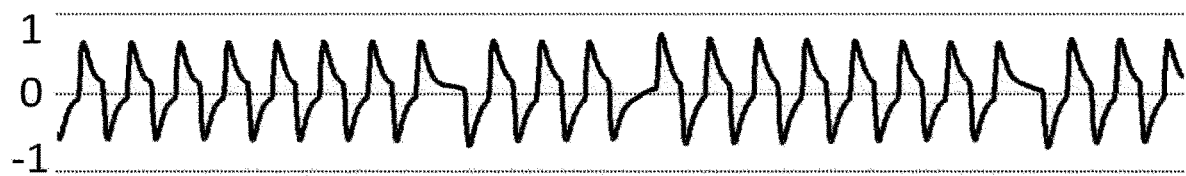
FIG. 4 illustrates an analog signal waveform acquired by the waveform acquisition unit 25 upon application of the digital signal of FIG. 2.

FIG. 3 and FIG. 4 illustrate an analog signal waveform acquired by the waveform acquisition unit 25 upon application of the digital signal of FIG. 2. More specifically, FIG. 3 illustrates an analog signal waveform acquired at the first measurement point 251, and FIG. 4 illustrates an analog signal waveform acquired at the second measurement point 252. In these drawings, a horizontal axis represents a time period, and a vertical axis represents a voltage (V).

Figure 5:
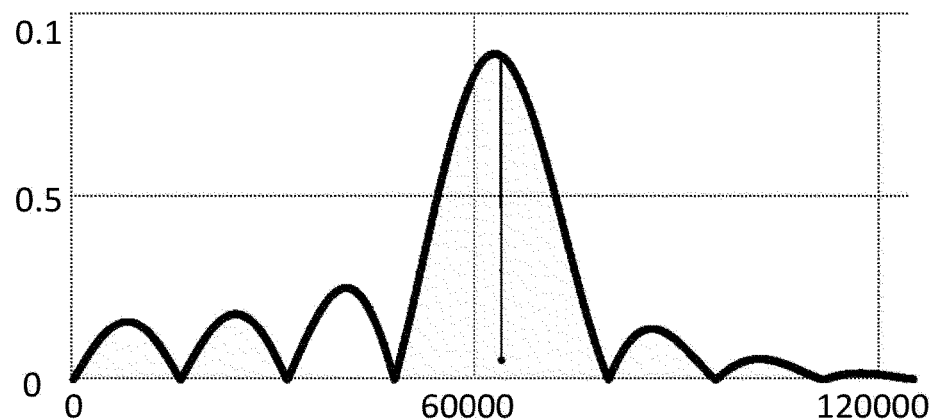
FIG. 5 illustrates an intensity distribution of the analog signal waveform acquired by the waveform acquisition unit 25 upon application of the digital signal of FIG. 2.

In addition, FIG. 5 illustrates an intensity distribution of the analog signal waveform acquired at the second measurement point 252, in which a horizontal axis represents a frequency (Hz), and a vertical axis represents an amplitude (Vrms) of a voltage. As illustrated in this drawing, according to the present operation example, the peak of the signal power can be positioned to be close to the resonance frequency (=60 kHz) of the device under test 100.

3. Operation

Figure 6:
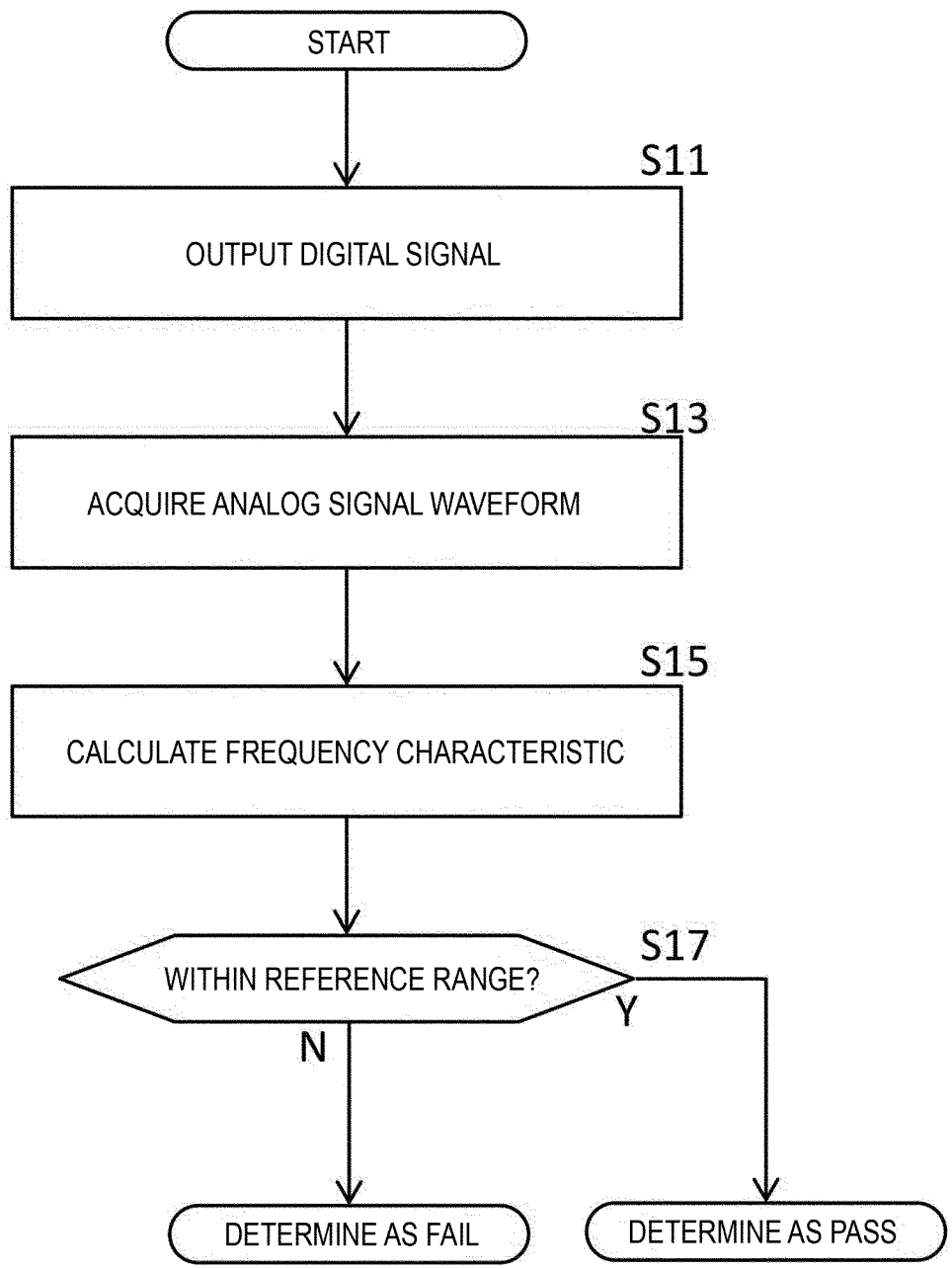
FIG. 6 illustrates an operation of a measurement apparatus 200.

FIG. 6 illustrates an operation of the measurement apparatus 200. The measurement apparatus 200 tests the device under test 100 by performing processing in steps S11 to S17.

In step S11, the signal source 22 outputs a binary digital signal configuring a multi-tone waveform. The signal source 22 may repeatedly output an upconverted signal by multiplication of the PRBS signal by the repeating rectangular wave with a reference frequency and a reference duty ratio.

In step S13, the waveform acquisition unit 25 acquires an analog signal waveform generated in response to application of a digital signal to the device under test 100. The waveform acquisition unit 25 may acquire an analog signal waveform via the low-pass filter 23. In addition, the waveform acquisition unit 25 may acquire the analog signal waveform at each of the first measurement point 251 and the second measurement point 252, and according to the present embodiment, as an example, may acquire the analog signal waveforms at the first measurement point 251 and the second measurement point 252 with regard to each of the plurality of devices under test 100. According to the present embodiment, as an example, the waveform acquisition unit 25 may simultaneously acquire the analog signal waveforms with regard to two or more of the devices under test 100.

In step S15, the computation unit 26 calculates the frequency characteristic of the device under test 100 from a waveform acquired by the waveform acquisition unit 25. The computation unit 26 may calculate an impedance of the device under test 100 as a frequency characteristic of the device under test 100. For example, the computation unit 26 may calculate the impedance R+jX (Ω) of the device under test 100 from the following expression (1).

$$R+jX=R1\{(V_{1i})/(V_{2r}+jV_{2i})-1\} \quad (1)$$

In Expression (1), R1 denotes a resistance value (Ω) of the reference resistor. Where $(V_{1r}+jV_{1i})$ represents a voltage signal of the analog voltage waveform acquired at the first measurement point 251, and ($V_{2r}$+j$V_{2i}$) represents a voltage signal of the analog voltage waveform acquired at the second measurement point 252.

In step S17, the determination unit 27 determines a quality of the device under test 100 based on the calculated frequency characteristic. When the calculated impedance is in a reference range (step S17; Yes), the determination unit 27 may determine the device under test 100 as pass, and when the impedance is out of the reference range (step S17; No), the determination unit 27 may determine the device under test 100 as fail.

4. Modified Example

Figure 7:
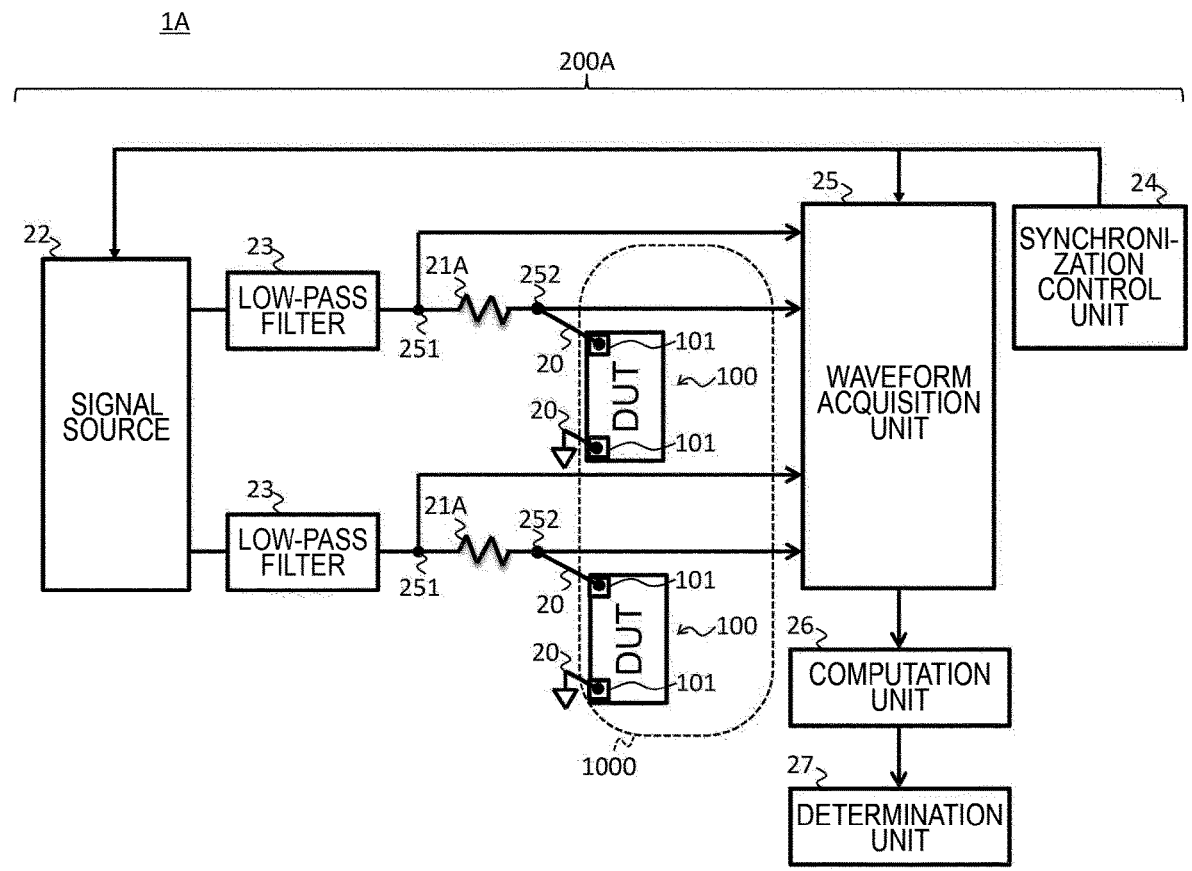
FIG. 7 illustrates a test system 1A according to a modified example.

FIG. 7 illustrates a test system 1A according to a modified example. A measurement apparatus 200A of the test system 1A has a reference resistor 21A. The reference resistor 21A is connected in series to the device under test 100 to configure a series circuit, and an end portion on the device under test 100 side in the series circuit is connected to a ground potential. In accordance with this test system 1A too, advantages similar to those of the test system 1 described above can be attained.

5. Other Modified Examples

Note that according to the above embodiment, the description has been provided where the computation unit 26 calculates the impedance as the frequency characteristic of the device under test 100, but in addition to or instead of the impedance, an admittance may be calculated. For example, the computation unit 26 may calculate the admittance by finding a reciprocal of the impedance.

In addition, the computation unit 26 may calculate a parameter of an element configuring an equivalent circuit of the device under test 100 as the frequency characteristic.

Figure 8:
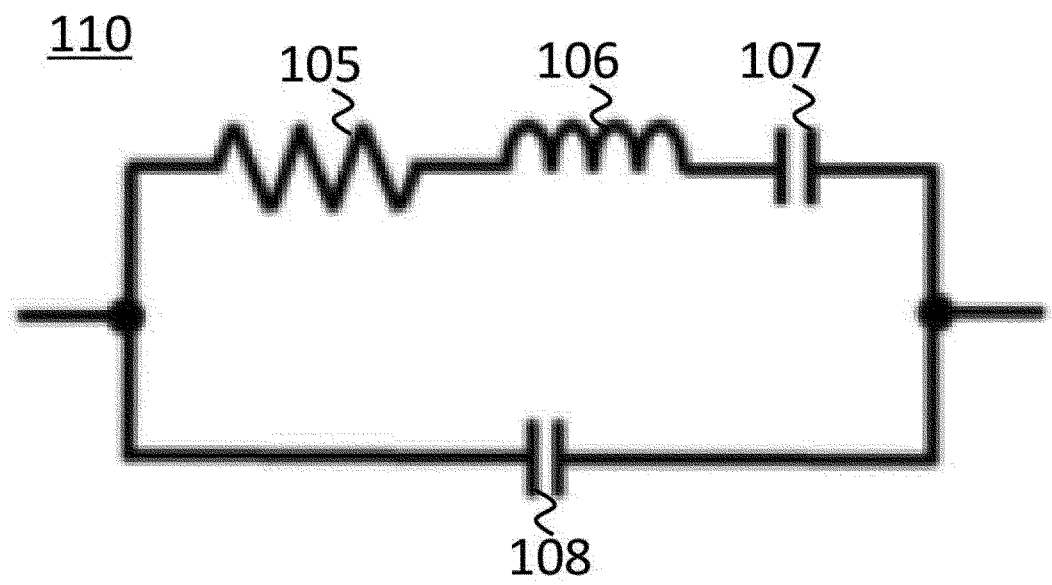
FIG. 8 illustrates an equivalent circuit 110 of a device under test 100.

FIG. 8 illustrates an equivalent circuit 110 of the device under test 100. The equivalent circuit 110 may have a resistor 105, an inductor 106, and an capacitor 107 which are connected in series to each other, and a capacitor 108 which is connected in parallel to a series circuit of those elements. The computation unit 26 may calculate a resistance value Rs of the resistor 105, an inductance Ls of the inductor 106, and capacitances Cs and Cp of the capacitors 107 and 108 as the frequency characteristic of the device under test 100.

Figure 9:
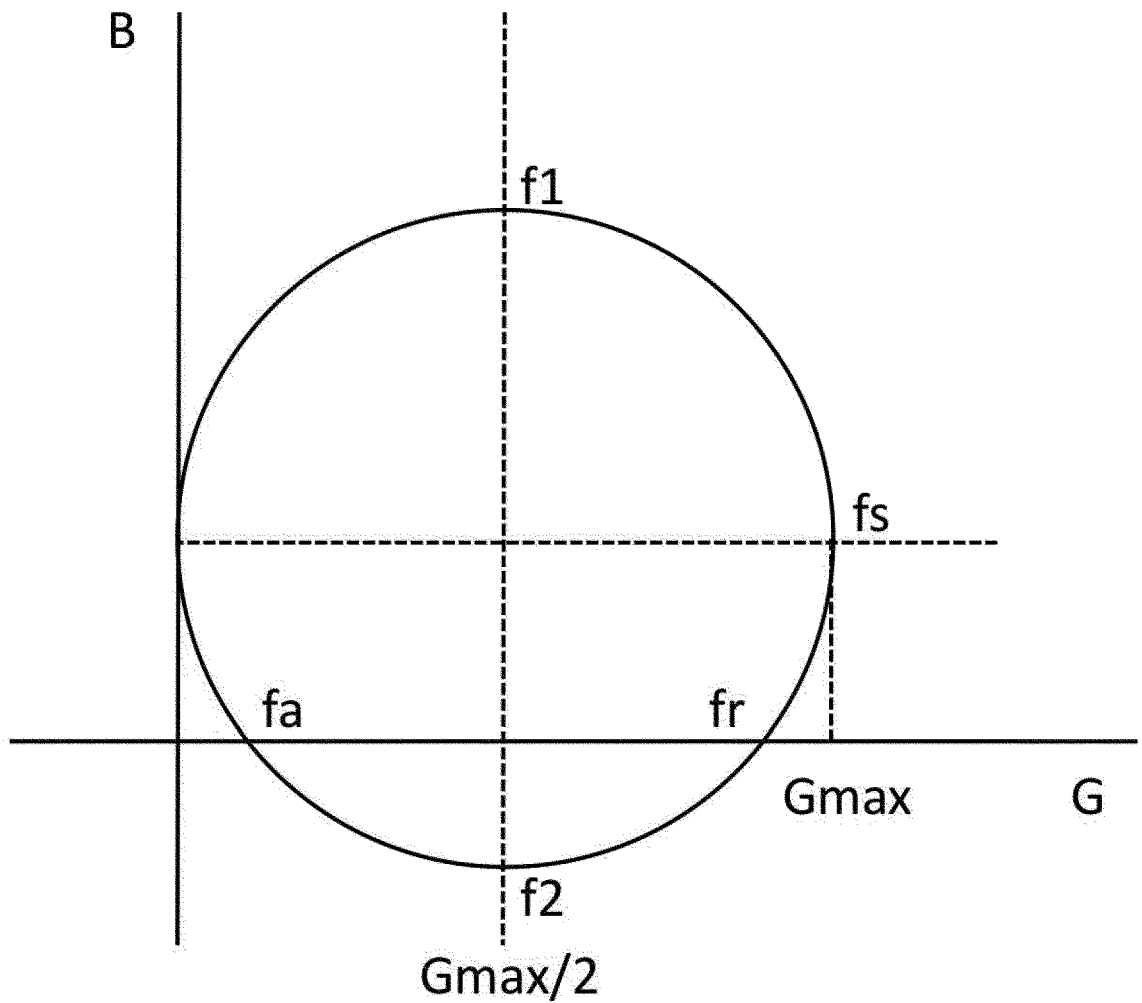
FIG. 9 illustrates a chart diagram of an admittance of the device under test 100.

FIG. 9 illustrates a chart diagram of an admittance of the device under test 100. A horizontal axis in the drawing represents a real part (G) of the admittance (Y=G+jB(s)), and a vertical axis represents an imaginary part (B). The computation unit 26 may calculate parameters Rs, Ls, Cs, and Cp using a peak frequency fs of the real part set from this chart diagram, frequencies f1 and f2 at ½ of the peak frequency of the real part, an antiresonance frequency fa (frequency intercepting B=0), a resonance frequency fr (frequency intercepting B=0), a maximum value Bmax of a conductance, and the following expressions (2) to (6).

$$Q=fs/(f2-f1) \quad (2)$$

$$Rs=1/Gmax \quad (3)$$

$$Ls=QRs/(2\pi fs) \quad (4)$$

$$Cs=1/(2\pi fsQRs) \quad (5)$$

$$Cp=Cs \cdot fr^2/(fa^2-fr^2) \quad (6)$$

When the computation unit 26 calculates the parameters Rs, Ls, Cs, and Cp, the determination unit 27 may determine the device under test 100 as faulty according to the peak frequency fs being higher than a reference frequency. In addition, the determination unit 27 may determine the device under test 100 as faulty according to the resistance value Rs being higher than a reference resistance value.

In addition, according to the above embodiment, the descriptions have been provided where the low-pass filter 23 is provided for each of the devices under test 100, but the low-pass filter 23 may be provided to be shared by the plurality of devices under test 100. For example, the low-pass filter 23 may be arranged between the signal source 22 and the plurality of devices under test 100.

In addition, the descriptions have been provided where the measurement apparatus 200 has the synchronization control unit 24, but as long as the analog signal waveform generated in response to the application of the digital signal from the signal source 22 to the device under test 100 is acquired by the waveform acquisition unit 25, the measurement apparatus 200 does not necessarily need to have the synchronization control unit 24.

In addition, the descriptions have been provided where the measurement apparatus 200 has the plurality of probes 20 electrically connected to the terminals 101 of the plurality of respective devices under test 100, but the measurement apparatus 200 may have only the probe 20 electrically connected to the terminal 101 of the single device under test 100.

In addition, the descriptions have been provided where the waveform acquisition unit 25 simultaneously acquires the analog signal waveforms of two or more of the devices under test 100, but may acquire the analog signal waveforms at separate timings. In this case, the measurement apparatus 200 may further include a switching unit (not illustrated) configured to switch a pair of the first measurement point 251 and the second measurement point 252 to be connected to the waveform acquisition unit 25 for each of the devices under test 100. In this case, costs of the measurement apparatus 200 are reduced corresponding to the decrease in the number of analog signal waveforms simultaneously acquired.

In addition, the descriptions have been provided where the waveform acquisition unit 25 simultaneously acquires the analog signal waveforms at the first measurement point 251 and the second measurement point 252 with regard to each of the devices under test 100, but may acquire the analog signal waveforms at separate timings. In this case, the measurement apparatus 200 may further include a switching unit (not illustrated) configured to switch a connection target of the waveform acquisition unit 25 between the first measurement point 251 and the second measurement point 252. In addition, the synchronization control unit 24 may synchronize the signal source 22 and the waveform acquisition unit 25 with each other both before and after the switching by the switching unit, and the waveform acquisition unit 25 may acquire the analog signal waveforms both before and after the switching by the switching unit. In this case too, the costs of the measurement apparatus 200 are reduced corresponding to the decrease in the number of analog signal waveforms simultaneously acquired.

In addition, the descriptions have been provided where the measurement apparatus 200 measures the frequency characteristic of the device under test 100 by the transfer impedance conversion method, but may measure the frequency characteristic by an IV method. In this case, the waveform acquisition unit 25 may acquire an analog signal waveform of a current flowing in the device under test 100 as a voltage waveform at both ends of the reference resistor connected in series to the device under test 100, and may also acquire analog signal waveforms of voltages at both ends of the device under test 100. In addition, the computation unit 26 may calculate the frequency characteristic of the device under test 100 from the acquired analog signal waveform.

In addition, the descriptions have been provided where the device under test 100 is the MEMS device, but may be an integrated circuit of a system on chip (SoC), may be a memory device, or may also be another semiconductor apparatus.

Various embodiments of the present invention may be described with reference to flowcharts and block diagrams, whose blocks may represent (1) steps of processes in which operations are executed or (2) sections of apparatuses responsible for executing operations. Certain steps and sections may be implemented by a dedicated circuit, a programmable circuit supplied with computer readable instructions stored on computer readable media, and/or processors supplied with computer readable instructions stored on computer readable media. The dedicated circuit may include a digital and/or analog hardware circuit, or may include an integrated circuit (IC) and/or a discrete circuit. The programmable circuit may include a reconfigurable hardware circuit including logical AND, logical OR, logical XOR, logical NAND, logical NOR, and other logical operations, a memory element such as a flip-flop, a register, a field programmable gate array (FPGA) and a programmable logic array (PLA), and the like.

A computer readable medium may include any tangible device that can store instructions to be executed by a suitable device, and as a result, the computer readable medium having instructions stored thereon includes an article of manufacture including instructions which can be executed to create means for performing operations specified in the flowcharts or block diagrams. Examples of computer readable media may include an electronic storage medium, a magnetic storage medium, an optical storage medium, an electromagnetic storage medium, a semiconductor storage medium, and the like. More specific examples of computer readable media may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a BLU-RAY (registered trademark) disk, a memory stick, an integrated circuit card, and the like.

Computer readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++, etc., and conventional procedural programming languages, such as the "C" programming language or similar programming languages.

Computer readable instructions may be provided to a processor of a general purpose computer, special purpose computer, or other programmable data processing apparatus, or to a programmable circuit, locally or via a local area network (LAN), wide area network (WAN) such as the Internet, or the like, to execute the computer readable instructions to create means for performing operations specified in the flowcharts or block diagrams. Examples of processors include computer processors, processing units, microprocessors, digital signal processors, controllers, microcontrollers, and the like.

Figure 10:
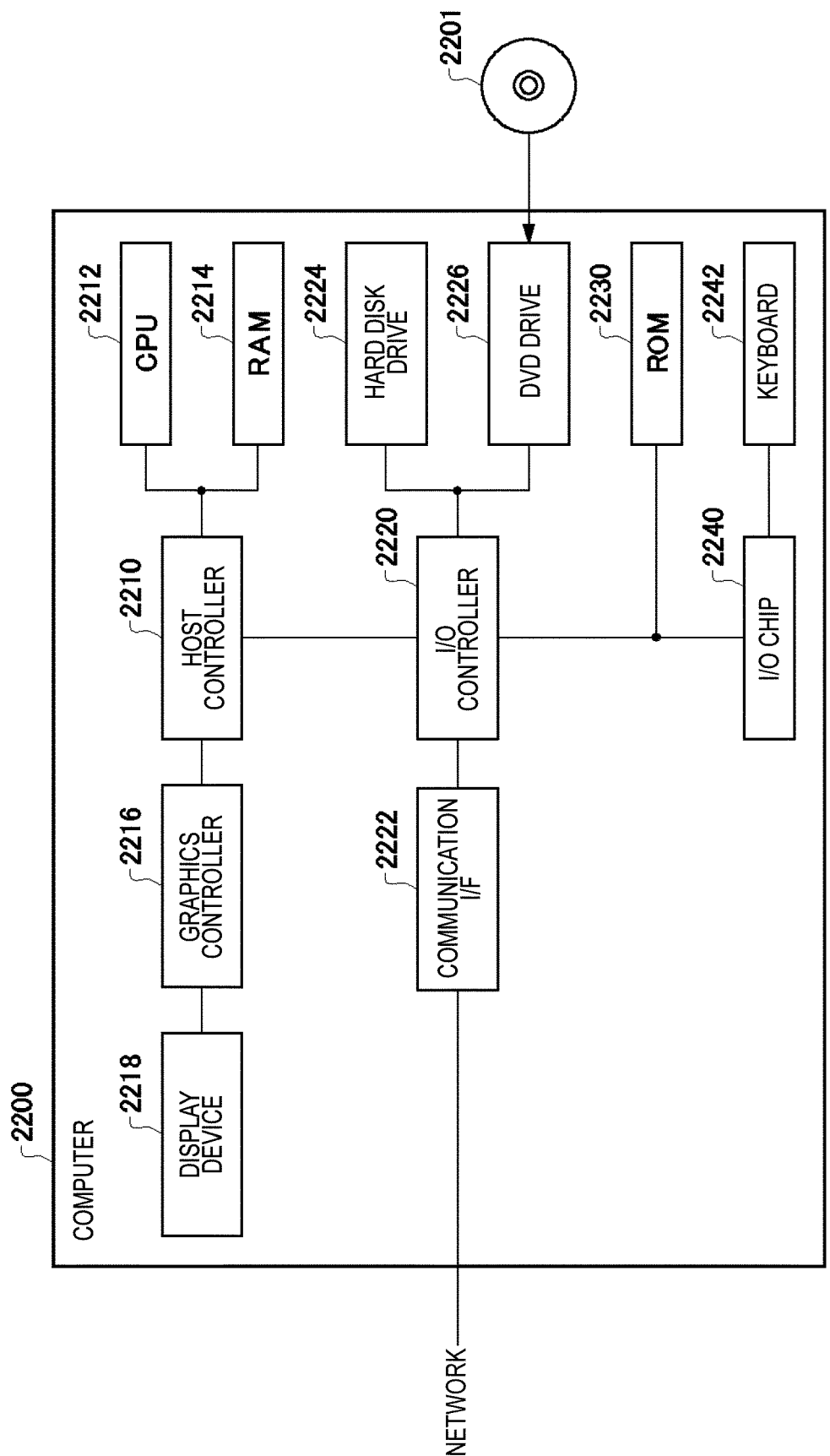
FIG. 10 illustrates an example of a computer 2200 in which a plurality of aspects of the present invention may be entirely or partially realized.

FIG. 10 illustrates an example of a computer 2200 in which a plurality of aspects of the present invention may be entirely or partially implemented. A program that is installed in the computer 2200 can cause the computer 2200 to function as or perform manipulations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain manipulations associated with some or all of the blocks of flowcharts and block diagrams described herein.

The computer 2200 according to the present embodiment includes a CPU 2212, a RAM 2214, a graphics controller 2216, and a display device 2218, which are mutually connected by a host controller 2210. The computer 2200 also includes an input/output unit such as a communication interface 2222, a hard disk drive 2224, a DVD-ROM drive 2226, and an IC card drive, which are connected to the host controller 2210 via an input/output controller 2220. The computer also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, or the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the abovementioned various types of hardware resources. An apparatus or method may be constituted by realizing the manipulation or processing of information in accordance with the usage of the computer 2200.

For example, when communication is executed between the computer 2200 and an external device, the CPU 2212 may execute a communication program loaded onto the RAM 2214, and instruct the communication interface 2222 to process the communication based on the processing written in the communication program. Under control of the CPU 2212, the communication interface 2222 reads transmission data stored in a transmission buffering region provided in a recording medium such as the RAM 2214, the hard disk drive 2224, the DVD-ROM 2201, or the IC card, and transmits the read transmission data to the network, or writes reception data received from the network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc. and perform various types of processes on data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of manipulations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The program or software modules described above may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 1 test system
20 probe
21 reference resistor
22 signal source
23 low-pass filter
24 synchronization control unit
25 waveform acquisition unit
26 computation unit
27 determination unit
100 device under test
101 terminal
105 resistor
106 inductor
107 capacitor
108 capacitor
110 equivalent circuit
200 measurement apparatus
251 first measurement point
252 second measurement point
2200 computer
2201 DVD-ROM
2210 host controller
2212 CPU
2214 RAM
2216 graphics controller
2218 display device
2220 input/output controller
2222 communication interface
2224 hard disk drive
2226 DVD-ROM drive
2230 ROM
2240 input/output chip
2242 keyboard

What is claimed is:

1. A measurement apparatus comprising:
a signal source configured to output a binary digital signal configuring a multi-tone waveform;
a waveform acquisition unit configured to acquire an analog signal waveform generated in response to application of the digital signal to a device under test;
a computation unit configured to calculate a frequency characteristic of the device under test from the waveform acquired by the waveform acquisition unit; and
a determination unit configured to determine a quality of the device under test based on the frequency characteristic calculated by the computation unit, wherein the determination unit determines the quality of the device under test to be faulty when the frequency characteristic calculated by the computation unit is out of a reference range, and
wherein the signal source is configured to repeatedly output a signal upconverted by multiplying a pseudo-random binary sequence (PRBS) signal by a repeating rectangular wave with a reference frequency and a reference duty ratio.

2. The measurement apparatus according to claim 1, further comprising:
a low-pass filter arranged between the signal source and the device under test.

3. The measurement apparatus according to claim 2, further comprising:
a reference resistor connected in series to the device under test, wherein
the waveform acquisition unit is configured to acquire the analog signal waveform at each of a measurement point on a side of the signal source relative to the device under test and the reference resistor and a measurement point between the device under test and the reference resistor.

4. The measurement apparatus according to claim 3, further comprising:
a probe arranged on a bottom surface of a liftable substrate and electrically connected to a terminal of the device under test, wherein
the low-pass filter and the reference resistor are arranged on the substrate.

5. The measurement apparatus according to claim 4, comprising:
a plurality of probes respectively electrically connected to a plurality of devices under test,
wherein each of the plurality of probes is a same as the probe, and each of the plurality of devices under test is a same as the device under test.

6. The measurement apparatus according to claim 3, wherein the device under test is located between the measurement point on the side of the signal source relative to the device under test and the reference resistor and the measurement point between the device under test and the reference resistor, and wherein the reference resistor is connected between the measurement point between the device under test and the reference resistor and a ground potential.

7. The measurement apparatus according to claim 3, wherein the reference resistor is connected between the measurement point on the side of the signal source relative to the device under test and the reference resistor and the measurement point between the device under test and the reference resistor, and wherein the device under test is connected between the measurement point between the device under test and the reference resistor and a ground potential.

8. The measurement apparatus according to claim 2, wherein the waveform acquisition unit is configured to acquire the analog signal waveform in synchronism with the signal source.

9. The measurement apparatus according to claim 1, further comprising:
a reference resistor connected in series to the device under test, wherein
the waveform acquisition unit is configured to acquire the analog signal waveform at each of a measurement point on a side of the signal source relative to the device under test and the reference resistor and a measurement point between the device under test and the reference resistor.

10. The measurement apparatus according to claim 9, wherein the device under test is located between the measurement point on the side of the signal source relative to the device under test and the reference resistor and the measurement point between the device under test and the reference resistor, and wherein the reference resistor is connected between the measurement point between the device under test and the reference resistor and a ground potential.

11. The measurement apparatus according to claim 9, wherein the reference resistor is connected between the measurement point on the side of the signal source relative to the device under test and the reference resistor and the measurement point between the device under test and the reference resistor, and wherein the device under test is connected between the measurement point between the device under test and the reference resistor and a ground potential.

12. The measurement apparatus according to claim 1, wherein the waveform acquisition unit is configured to acquire the analog signal waveform in synchronism with the signal source.

13. The measurement apparatus according to claim 1, wherein the device under test is an MEMS device.

14. A measurement method comprising:
outputting a binary digital signal configuring a multi-tone waveform;
acquiring an analog signal waveform generated in response to application of the digital signal to a device under test;
calculating a frequency characteristic of the device under test from the acquired waveform; and
determining a quality of the device under test based on the frequency characteristic that is calculated, wherein in determining the quality of the device under test, the device under test is determined to be faulty when the frequency characteristic that is calculated is out of a reference range, and
wherein the binary digital signal is obtained by repeatedly outputting a signal upconverted by multiplying a pseudo-random binary sequence (PRBS) signal by a repeating rectangular wave with a reference frequency and a reference duty ratio.

15. A non-transitory computer readable medium having stored thereon a program for causing a computer to function as:
a signal source configured to output a binary digital signal configuring a multi-tone waveform;
a waveform acquisition unit configured to acquire an analog signal waveform generated in response to application of the digital signal to a device under test;
a computation unit configured to calculate a frequency characteristic of the device under test from the waveform acquired by the waveform acquisition unit; and
a determination unit configured to determine a quality of the device under test based on the frequency characteristic calculated by the computation unit, wherein the determination unit determines the quality of the device under test to be faulty when the frequency characteristic calculated by the computation unit is out of a reference range, and
wherein the signal source is configured to repeatedly output a signal upconverted by multiplying a pseudo-random binary sequence (PRBS) signal by a repeating rectangular wave with a reference frequency and a reference duty ratio.

* * * * *